United States Patent
Nilles et al.

(10) Patent No.: US 11,050,280 B2
(45) Date of Patent: Jun. 29, 2021

(54) REGULATED POWER SOURCES

(71) Applicant: Snap Inc., Santa Monica, CA (US)

(72) Inventors: Gerald Nilles, Culver City, CA (US);
Russell Douglas Patton, Playa Vista, CA (US); Raul Alejandro Perez, Vega Baja, PR (US); Patrick Timothy Mcsweeney Simons, Redondo Beach, CA (US)

(73) Assignee: Snap Inc., Santa Monica, CA (US)

( * ) Notice: Subject to any disclaimer, the term of this patent is extended or adjusted under 35 U.S.C. 154(b) by 0 days.

(21) Appl. No.: 16/446,781

(22) Filed: Jun. 20, 2019

(65) Prior Publication Data
US 2020/0006971 A1 Jan. 2, 2020

Related U.S. Application Data

(60) Provisional application No. 62/691,370, filed on Jun. 28, 2018.

(51) Int. Cl.
*H02M 7/5387* (2007.01)
*H02M 1/12* (2006.01)
(Continued)

(52) U.S. Cl.
CPC .......... *H02J 7/0063* (2013.01); *G01R 31/388* (2019.01); *G01R 31/3842* (2019.01); *G02C 11/10* (2013.01); *H02J 2007/0067* (2013.01)

(58) Field of Classification Search
CPC ............. G01R 31/388; G01R 31/3842; H01M 10/425; H01M 2010/4271; H01M 2/1022;
(Continued)

(56) References Cited

U.S. PATENT DOCUMENTS 3,956,638 A * 5/1976 Ahrens .................... G05F 1/59
307/48
6,330,463 B1 * 12/2001 Hedrich .................. H02J 9/061
455/343.6
(Continued)

FOREIGN PATENT DOCUMENTS

EP      1837944 A2    9/2007
EP      2315336 A1    4/2011
(Continued)

OTHER PUBLICATIONS

International Search Report and Written Opinion for International Application No. PCT/US2019/038115, dated Oct. 2, 2019 (dated Oct. 2, 2019)—13 pages.

*Primary Examiner* — Jared Fureman
*Assistant Examiner* — Esayas G Yeshaw
(74) *Attorney, Agent, or Firm* — Culhane Meadows PLLC; Stephen J. Weed

(57) ABSTRACT

Disclosed herein are regulated power supplies. The power source delivers power to a system load and includes battery units. The power source also includes power flow devices coupled to the battery units that are configured to provide power from the battery units to the system load. Each power flow device corresponds to a respective one of the battery units, and includes a one direction current flow device connected in series with a current regulator between the respective battery unit and the system load.

18 Claims, 8 Drawing Sheets

(51) Int. Cl.
*H02J 7/00* (2006.01)
*H02J 7/02* (2016.01)
*G01R 31/3842* (2019.01)
*G01R 31/388* (2019.01)
*G02C 11/00* (2006.01)

(58) Field of Classification Search
CPC ............... H01M 2220/30; H02J 7/0025; H02J 2207/20; H02J 7/0063; H02J 7/0024; H02J 2007/0067; G02C 11/10
See application file for complete search history.

(56) References Cited

U.S. PATENT DOCUMENTS

| | | | | |
|---|---|---|---|---|
| 6,346,794 | B1* | 2/2002 | Odaohhara | H02J 7/0022 320/116 |
| 2011/0307113 | A1* | 12/2011 | Kumar | B60M 3/00 700/291 |
| 2015/0229155 | A1* | 8/2015 | Sporck | H02J 7/0091 320/107 |
| 2016/0230680 | A1* | 8/2016 | DeMarco | H02P 9/04 |
| 2017/0222208 | A1 | 8/2017 | Yamazaki | |
| 2018/0034267 | A1* | 2/2018 | Vasefi | H02J 1/00 |
| 2020/0127467 | A1* | 4/2020 | Li | H02J 7/0013 |

FOREIGN PATENT DOCUMENTS

| | | |
|---|---|---|
| GB | 2292845 A | 3/1996 |
| WO | 2015112178 A2 | 7/2015 |

* cited by examiner

REGULATED POWER SOURCES

FIELD

The subject matter disclosed herein generally relates to a power source for regulating power supplied to a system load and uses of the same.

BACKGROUND

Power sources with additional capacity are needed to address the ever-increasing energy requirements of electronic components. Such power sources typically include multiple batteries, which require regulation for safe and efficient discharge.

BRIEF DESCRIPTION OF THE FIGURES

The invention is best understood from the following detailed description when read in connection with the accompanying drawings, with like elements having the same reference numerals. When a plurality of similar elements are present, a single reference numeral may be assigned to the plurality of similar elements with a small letter designation referring to specific elements. When referring to the elements collectively or to a non-specific one or more of the elements, the small letter designation may be dropped. This emphasizes that according to common practice, the various features of the drawings are not drawn to scale unless otherwise indicated. On the contrary, the dimensions of the various features may be expanded or reduced for clarity. Included in the drawings are the following figures.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and circuitry have been described at a relatively high-level, without detail, in order to avoid unnecessarily obscuring aspects of the present teachings.

The term "coupled" as used herein refers to any logical, optical, physical or electrical connection, link or the like. Unless described otherwise, coupled elements or devices are not necessarily directly connected to one another and may be separated by intermediate components or elements.

Figure 1A:
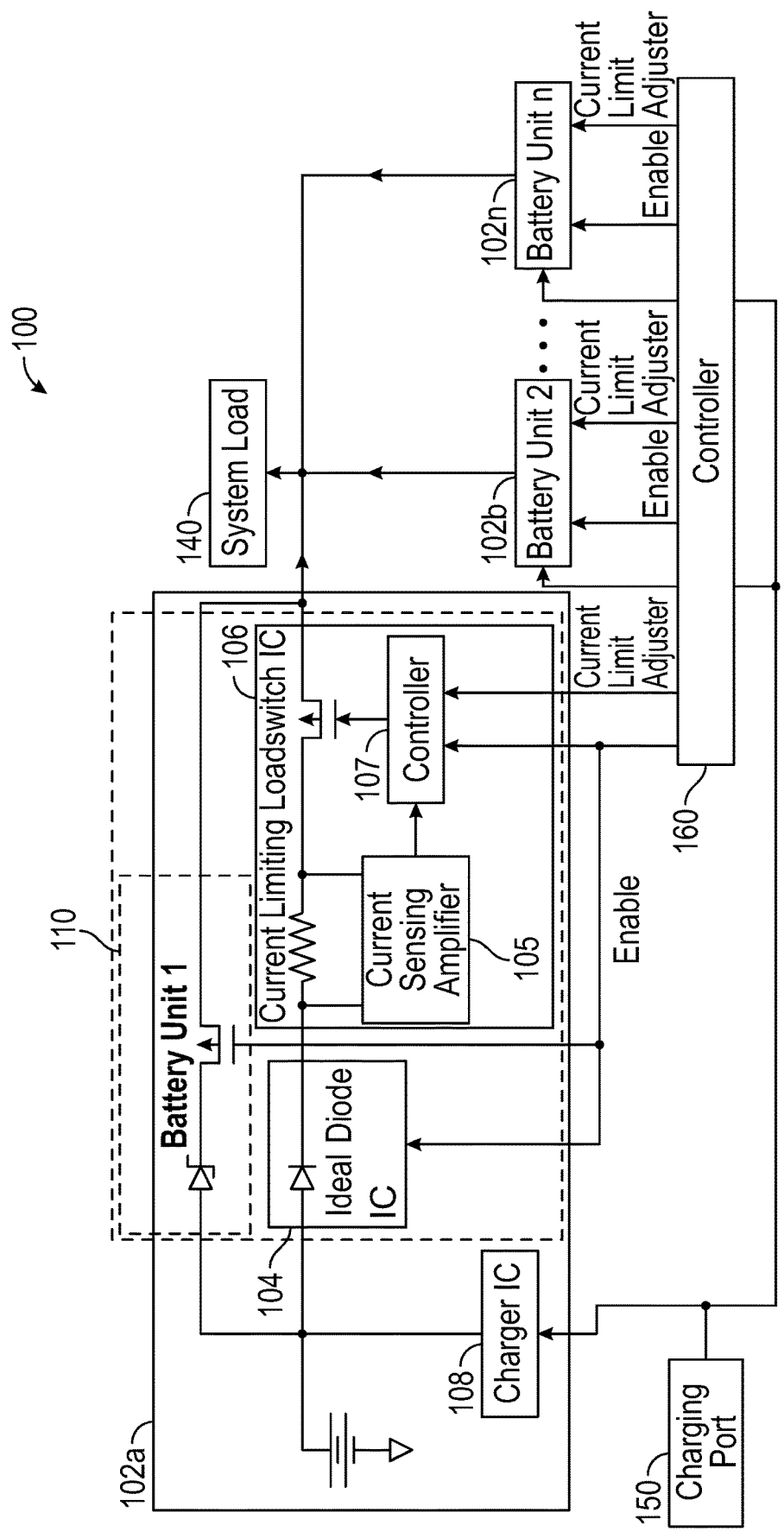
FIG. 1A is a high level block diagram of example electronic components of a power source for delivering power to a system load.

FIG. 1A depicts a high-level block diagram of example electronic components of a power source 100 coupled to a system load 140, a charging port 150, and a controller 160. The power source 100 is configured to supply power to the system load 140. The system load may be essentially any device that consumes power. Some examples of the system load includes a system processor, image processor, display, sensor etc. As shown, the power source 100 includes a plurality of battery units 102a-102n connected in parallel with each other. Each of the plurality of battery units 102 is coupled to the system load 140. Each of the plurality of battery units 102 draws current and thus has its own rated current, which may be the same or different as other battery units 102. In one example, the controller 160 is configured to dynamically control the battery units 102 to maintain the rated current of each battery unit in order to maximize the energy extraction as discussed in detail below.

In one example, each battery unit 102 includes an ideal diode 104 (e.g., a one direction current flow device with very low forward voltage drop and reverse current leakage), a current limiting load switch 106, and a charger 108. The controller 160 is coupled to the current limiting load switch 106 to control the maximum amount that flows from the respective battery unit 102. The ideal diode 104 is connected in series with the current limiting load switch 106 to prevent current from flowing between the battery units 102.

The current limiting load switch 106 of each battery unit 102 is configured to limit the current flowing through that current limiting load switch 106 to a set current limit, which can be individual adjusted for each respective battery unit 102. In one example, the controller 160 functions to dynamically adjust the respective current limit of the current limiting load switch 106 to prevent the respective battery unit 102 from exceeding its respective rated current, which may be used to even discharge the battery units 102 in order to maximize energy extraction.

The illustrated current limiting load switch 106 includes a current sensing amplifier 105 and a current controller 107. The current sensing amplifier 105 functions to determine current flow from the respective battery unit 102 (e.g., by measuring a voltage, v, across a resistance, r, having a known value, and computing the current, $i=v/r$). The current controller 107 adjusts the respective current limit (e.g., using a metal oxide semiconductor field effect transistor; MOSFET) with input from the current sensing amplifier 105 and under control of the controller 160 to maintain the current flow of the respective battery unit 102 from exceeding the set current limit.

In one example, each battery unit 102 includes a respective charger 108 and all chargers 108 are connected to a common charging port 150. In accordance with this example, the charger 108 of a respective battery unit 102 is configured control the current flow into that battery unit 102.

Although the example of FIG. 1A illustrates each of the ideal diode 106, the current limiting load switch 106, and the charger 108 positioned within their respective battery units 102a-102n, in another example, the ideal diode 104, the charger current limiting load switch 106 and/or the charger 108 may be positioned outside their respective battery units 102a-102n (e.g., in an integrated circuit (IC)).

As shown in FIG. 1A, the battery units 102 may also include a Schottky circuit 110 (e.g., a Schottky diode coupled in parallel with the ideal diode 104 and the current limiting load switch 106). The controller 160 may selectively enable/disable the ideal diode 104, the current limiting load switch 106, and the Schottky circuit 110. In one example, the controller 160 enables the ideal diode 104 and current limiting load switch 106 and disables the Schottky circuit during a normal/active operation mode (i.e., first mode of operation) and the controller 160 disables the ideal diode 104 and current limiting load switch 106 and enables the Schottky circuit 110 during a low power operation mode (e.g., sleep/off power operation mode; i.e., second mode of operation). As Schottky diodes have a higher forward voltage drop and a lower leakage current, the Schottky circuit is useful in minimizing standby current consumption of the battery unit.

Figure 1B:
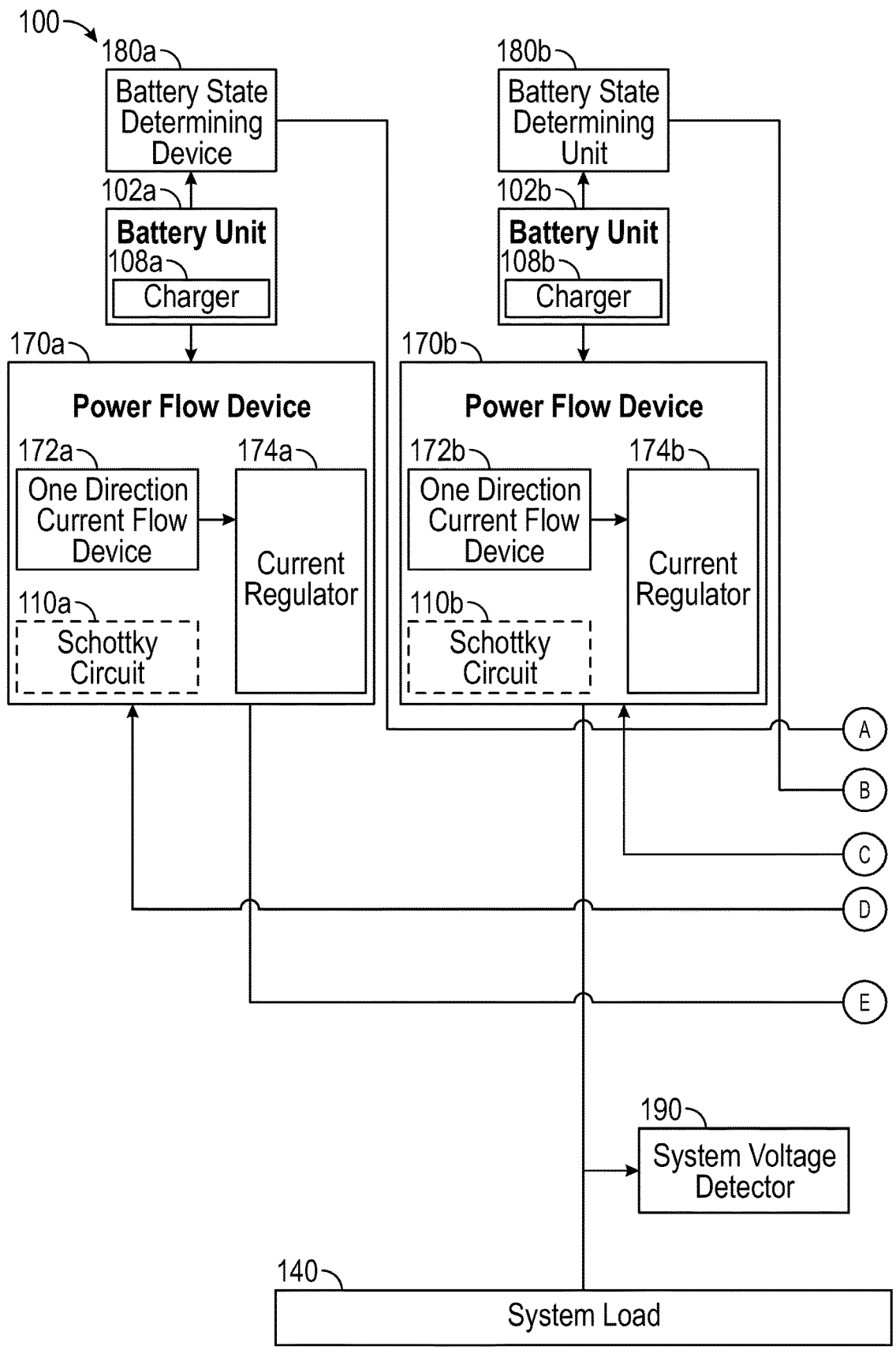
FIG. 1B is a block diagram of an example operation of the power source of FIG. 1A.
Figure 1B:
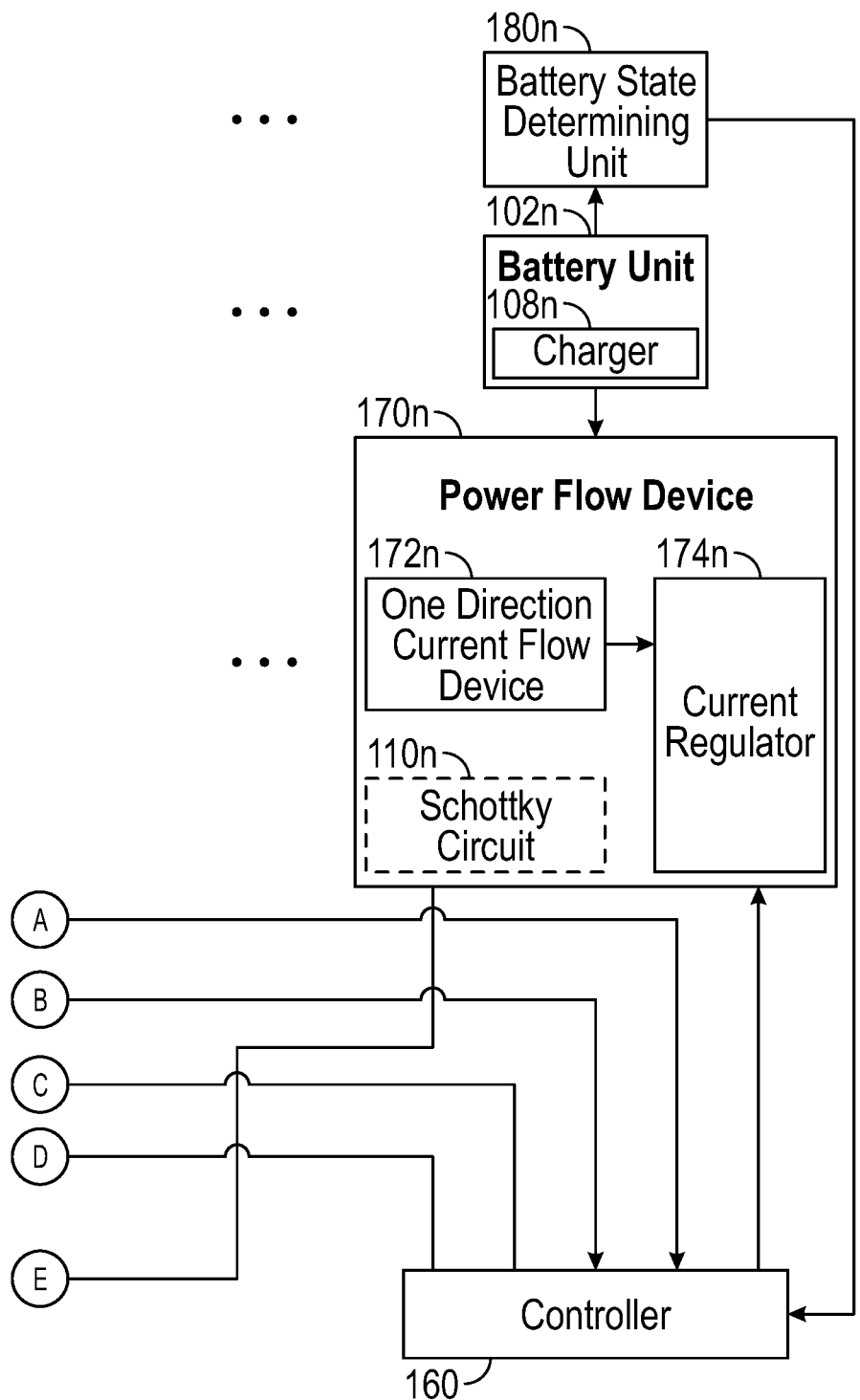

FIG. 1B depicts a block diagram illustrating an example operation of the power source 100 of FIG. 1A. The power source 100 includes a plurality of power flow devices 170a-170n, each of which are coupled to its corresponding battery units 102. Each of the power flow devices 170 provide power from the corresponding battery unit 102 to the system load 140 when the corresponding battery unit is connected to the system load 140. As shown, each of the power flow devices 170a-170n includes a one-direction current flow device 172a-172n (e.g., ideal diode 104 of FIG. 1A) and a current regulator 174a-174n (e.g., current limiting load switch 106 of FIG. 1A). Each of the one direction current flow devices 172 functions to prevent the flow of current between each of its respective battery units 102. Each of the current regulators 174 functions to regulate the current flowing from its respective battery units 102a-102n to the system load 140. Each of the one direction current flow devices 172a-172n is connected in series with the corresponding current regulator 174a-174n between the respective battery unit 102a-102n and the system load 140.

The illustrated power source 100 includes a plurality of battery state determining devices 180a-180n coupled to the respective battery units 102 and the controller 160. Each of the plurality of battery state determining devices 180 determines a current state of charge of the respective battery units 102. The battery-determining device 180 of each battery unit 102 sends the respective current state of charge to the controller 160. In one example, controller 160 is configured to adjust the current limit in the each of the respective power flow devices 170 based on a state of the charge of the respective battery units 102.

In one example, assuming two battery units, the battery state determining device 180a sends a current state of charge of the battery unit 102a to the controller 160 and the battery state-determining device 180b sends the current state of charge of the battery unit 102b to the controller 160. If the current state of charge for the battery unit 102a is at a level lower (e.g., percentage capacity wise) than the current state of charge for the battery unit 102b, the controller 160 may decrease the set current limit of the first battery unit 102a, which results in the first battery unit discharging at a slower rate. For example, if the system load 140 requires 800 mA and each of the battery units 102a and 102b is set with an initial current limit value of 400 mA to run the system load 140. In one scenario, if it is determined that the current state of charge of the battery unit 102b is 50% and the current state of charge of the battery unit 102a is 80%. The controller 160 may decrease the current limit of battery unit 102b to 200 mA and increase the current limit of battery unit 102a to 600 mA in order to even out the discharge level of the two battery units 102a and 102b.

Each of the power flow devices 172a-172n includes the Schottky circuit 110a-110n described above.

A system voltage detector 190 is coupled to the system load 140 and is configured to detect a system voltage level of the system load 140. In one example, the controller 160 is coupled to the system voltage detector 190 to receive/detect the system voltage level. If the controller 160 determines that the system voltage level of the system load 140 is below a threshold voltage level (e.g., a minimum voltage required to activate or maintain activation in the system load 140), the controller 160 may function to briefly increase current output (e.g., to a maximum amount) from each of the plurality of battery units 102a-102n connected to the system load 140. Specifically, the controller 160 functions to enable each of the current regulators 174a-174n to increase the current limit. In one example, the current limit is increased for a very short period of time (e.g., 20 milliseconds) until the system load is either activated or is maintained for activation.

Figure 2A:
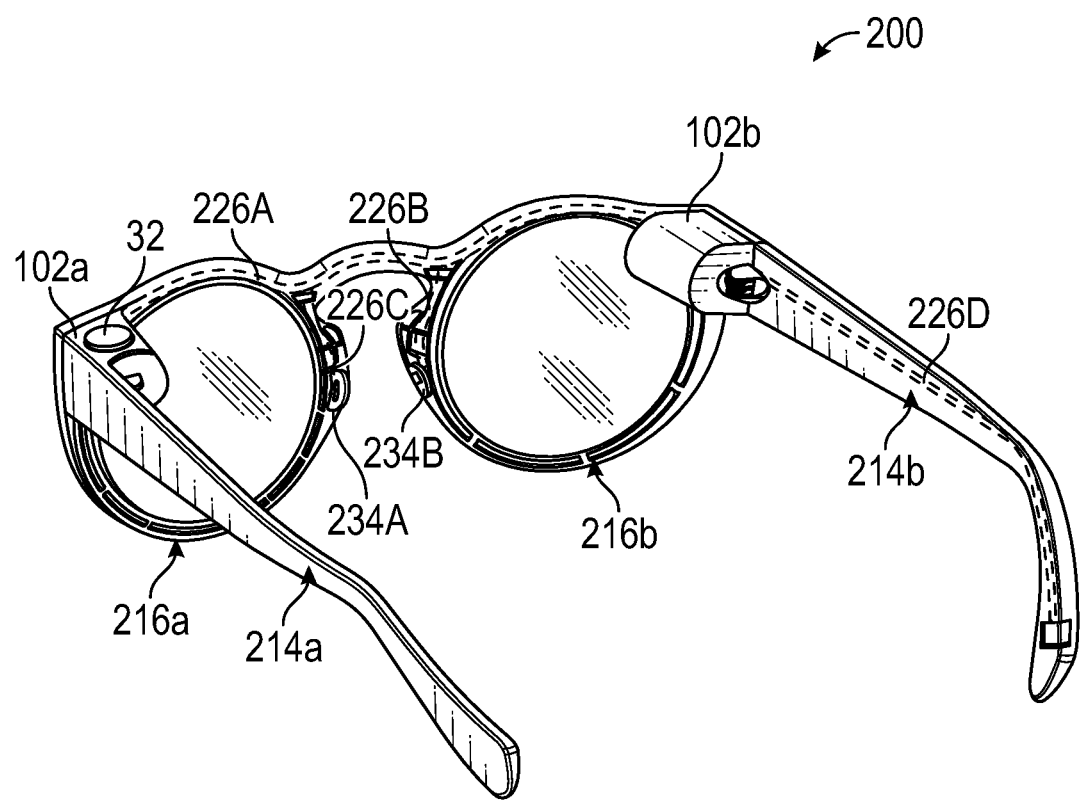
FIG. 2A is a perspective view of example eyewear including electronic components of a power source and a support structure supporting the electronic components.

FIG. 2A depicts a perspective view of example eyewear 200 including components of the power source 100 (FIG. 1A). The illustrated eyewear 200 includes a support structure 213 that has temples 214A and 214B and a frame 216. The frame 216 is transparent for illustration purposes. Support structure 213 is configured to support one or more optical elements within a field of view of a user when worn by a user. For example, the frame 216 is configured to support the one or more optical element. As used herein, the term "optical elements" refers to lenses, transparent pieces of glass or plastic, projectors, screens, displays and other devices for presenting visual images or through which visual images may be perceived by a user.

The power source 100 functions to power the eyewear 200. Support structure 213 is configured to support the power source 100. The frame 216 includes a first side 216a and a second side 216b. As illustrated, in one example, a first battery unit 102a is positioned on the first side 216a and a second battery unit 102b is positioned on the second side 216b. In one example, the eyewear 200 includes the charging port 150 (not shown) coupled to each of the first and the second battery units 102a and 102b, respectively, via a flexible printed circuit board (FPCB) 226A, B. In addition, eyewear 200 includes system load 140 (not shown) installed at one or more locations throughout frame 216 and/or temples 214A and 214B. The system load 140 may include a system processor, an image processor, a display, and/or a sensor, and may be coupled to the first and the second battery units 102a and 102b, respectively, e.g., through one or more FPCBs.

The FPCB 226A and 2226B as shown in FIG. 2A are embedded within the frame 216. The FPCB 226 may include a power bus coupled to both the first and the second battery units 102a and 102b. For example, as shown in FIG. 2A, the FPCB 226 is routed throughout the frame 216 extending to both the first and the second sides 216a and 216b to electrically connect the first and the second battery units 102a and 102b together. The FPCB 226 may include one or more electrical traces for routing electrical signals between the first and the second battery units 102a and 102b.

FPCBs 226 are routed through various portions of frame 216 (and optionally or alternatively the temples 214A and 214B) to electrically connect the first and the second battery units 102a and 102b together, to the system load 140, and to the power flow components. For example, as shown in FIG. 2A, FPCB 226A (primary FPCB) is routed through frame 216 to electrically connect the first and the second battery units 102a and 102b together. Additionally, secondary FPCB 226B, C may extend from the main FPCB 226A to other components such as sensors (not shown) embedded into a nose pads 234A, 234B. In another example, a further FPCB 226D extends from the main FPCB 226A to components embedded into the temple 214B. As such, the use of secondary FPCBs allow other electronic devices to be embedded at various locations throughout the structure of eyewear 200. These electronic devices are positioned to provide a way to regulate power from the power source 100 supplied to power the eyewear 200.

FPCBs 226A, 226B, 226C and 226D include one or more electrical traces for routing electrical signals between the first and the second battery units 102a and 102b respectively and the other electronic devices. These FPCBs may be embedded in the frame and temples of eyewear 200 during the manufacturing process.

For example, during a first shot of a two-shot molding process, plastic is injected into a mold to form the front half of frame 216 and/or temple 214A. After forming the front halves, the FPCBs, along with any electronic components are inserted and positioned within the mold at locations with respect to the front halves. During a second shot of the two-shot molding process, more plastic is injected into the mold to cover the components and form the back half of frame 216 or temple 214A such that the FPCBs and electronics are embedded between the front and back halves of frame 216 and/or temple 214A. After the frame and both temples are formed using the molding process, they are connected together (e.g., fasteners such as screws and/or fastening materials such as glue) to form the finished eyewear 200.

Figure 2B:
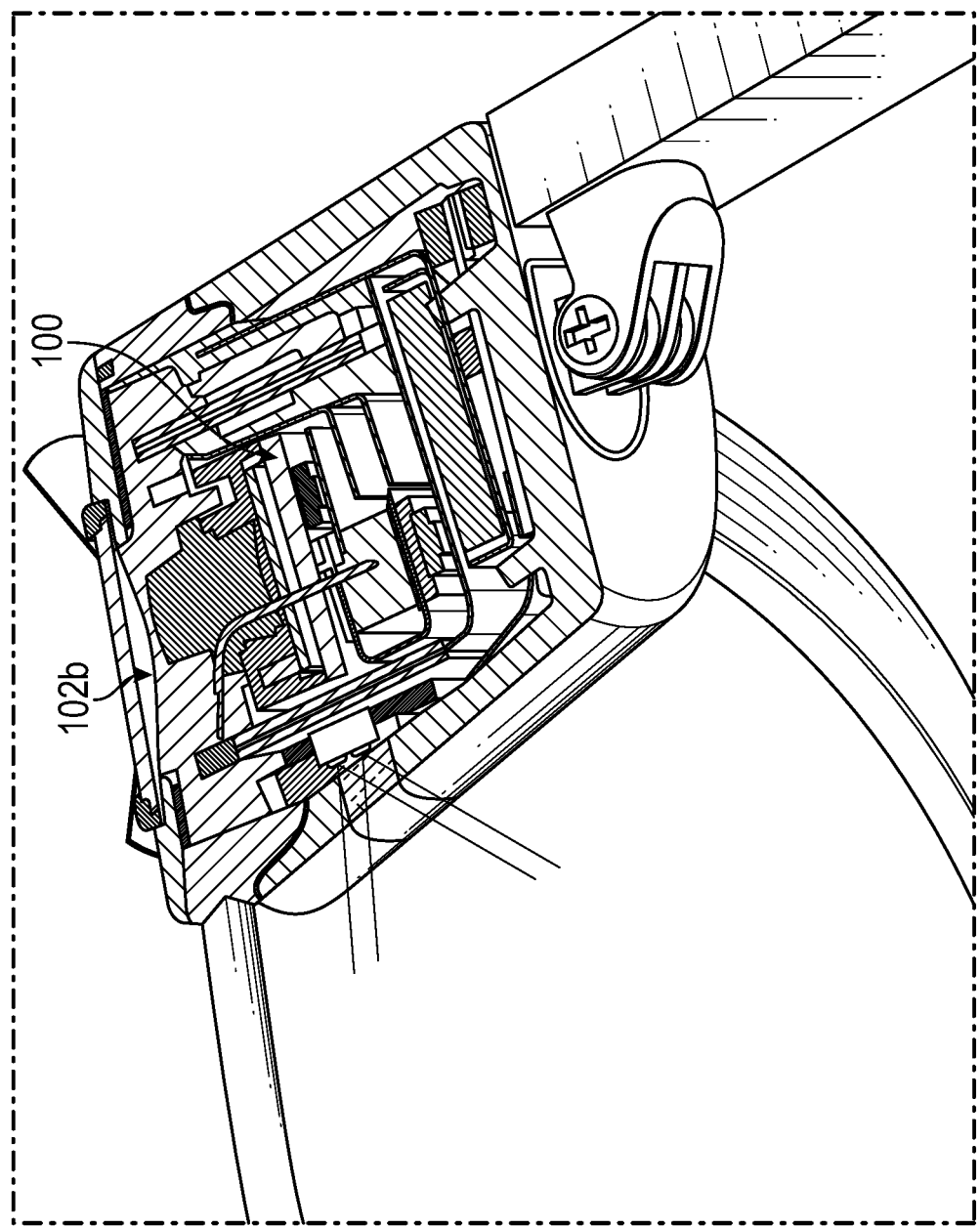
FIG. 2B is an illustration of a power source installed on a frame of the eyewear of FIG. 2A.

FIG. 2B illustrates a close up exploded view of a portion of the power source 100 embedded into the frame 216 of the eyewear 200 of FIG. 2A. In the illustrated example, the second battery unit 102b is housed in the second side 216b of the frame 216 of the eyewear 200. As discussed above, the second battery unit 102b is associated with a second power flow device 170b configured to prevent current from flowing between the second battery unit 102b and other respective battery units and to prevent the second battery unit 102b from exceeding a set current discharge limit. In one example, the second power flow device 170b is co-located with the second battery unit 102b. In another example, one or more components of the power flow device 170b may be distinct and separate from the second battery unit 102b.

Figure 3:
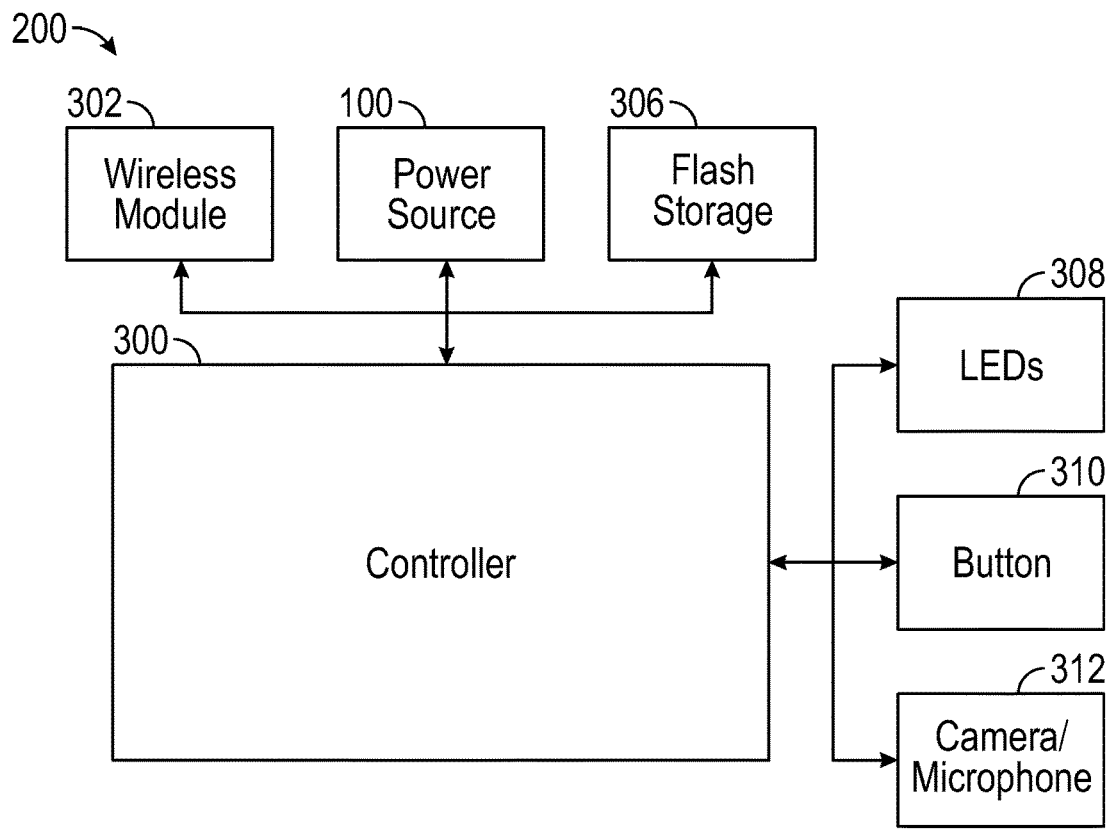
FIG. 3 is a block diagram of an example of the electronic components supported by the eyewear of FIG. 2A.

FIG. 3 is a block diagram of example electronic components of the eyewear 200 of FIG. 2A. The illustrated electronic components include a controller 300 (e.g. system processor, image processor, etc.) for controlling the various devices in eyewear 200, wireless module (e.g. Bluetooth™) 302 for facilitating communication between eyewear 200 and a client device (e.g. Smartphone), power source 100 for powering eyewear 200, flash storage 306 for storing data (e.g., images, video, image processing software, etc.), LEDs 308 (e.g. colored LEDs) for providing information to the user, button 310 for triggering eyewear 200 to capture images/video, camera/microphone 312 for capturing images/video and sound, and a physical activity sensor (e.g., accelerometer sensing movement, button such as button 310 pressed by a user, switch incorporated into a hinge to detect when a respective temple is moved from a collapsed condition to a wearable condition, etc.).

Wireless module 302 may connect with a client device such as a smartphone, tablet, phablet, laptop computer, desktop computer, networked appliance, access point device, or any other such device capable of connecting with wireless module 302. These connections may be implemented, for example, using any combination of Bluetooth, Bluetooth LE, Wi-Fi, Wi-Fi direct, a cellular modem, and a near field communication system, as well as multiple instances of any of these systems. Communication may include transferring software updates, images, videos, sound between eyewear 200 and the client device (e.g., images captured by eyewear 200 may be uploaded to a smartphone).

Camera/microphone 312 for capturing the images/video may include digital camera elements such as a charge-coupled device, a lens, or any other light capturing elements that may be used to capture image data. Camera/microphone 312 includes a microphone having a transducer for converting sound into an electrical signal.

Button 310 may be a physical button that, when depressed, sends a user input signal to controller 300. A press of button 310 for a predetermined period of time (e.g., three seconds) may be processed by controller 300 as a request to turn on eyewear 200 (e.g., transition eyewear 200 from a second mode (e.g., an off or sleep mode of operation) to a first mode (e.g., normal or active mode of the operation). In one example, the controller 300 may send a command to the current controller 107 of the respective battery unit 102 to switch from the first mode to the second mode of the operation and vice versa.

Controller 300 is a controller that controls the electronic components. For example, controller 300 includes circuitry to receive signals from camera 312 and process those signals into a format suitable for storage in memory 306. Controller 300 is structured such that it may be powered on and booted to operate in a normal operational mode, or to enter a sleep mode. Depending on various power design elements controller 300 may still consume a small amount of power even when it is in an off state and/or a sleep state. This power will, however, be negligible compared to the power used by controller 300 when it is in an on or the active state, and will also have a negligible impact on battery life.

In one example, controller 300 includes a microprocessor integrated circuit (IC) customized for processing sensor data from camera 312, along with volatile memory used by the microprocessor to operate. The memory may store software code for execution by controller 300. For example, the software code may instruct controller 300 to control the mode of operation of the electronic components.

Each of the electronic components require power to operate. As described above, power source 100 that may include a battery (e.g. 102a-102n of FIGS. 1A and 1B), power converter and distribution circuitry (e.g., FPCBs). The battery units may include rechargeable batteries such as lithium-ion or the like. Power converter and distribution circuitry may include electrical components for filtering and/or converting voltages for powering the various electronic components.

LEDs 308, among other uses, may be used as indicators on eyewear 200 to indicate a number of functions. For example, LEDs 308 may illuminate each time the user presses button 310 to indicate that eyewear 200 is recording images and/or video and/or sound.

The various connections between controller 300 and the other electronic components including the sensors shown in FIG. 2A are accomplished through wires, PCBs and FPCBs. These electrical connections are routed through various portions of frame 216 and/or temples 214A and 214B during the manufacturing (e.g., two-shot molding) process. Once eyewear 200 is manufactured, these electrical connections are fully embedded in the eyewear and may or may not be visible to the user based on the opacity of the manufacturing material.

Figure 4:
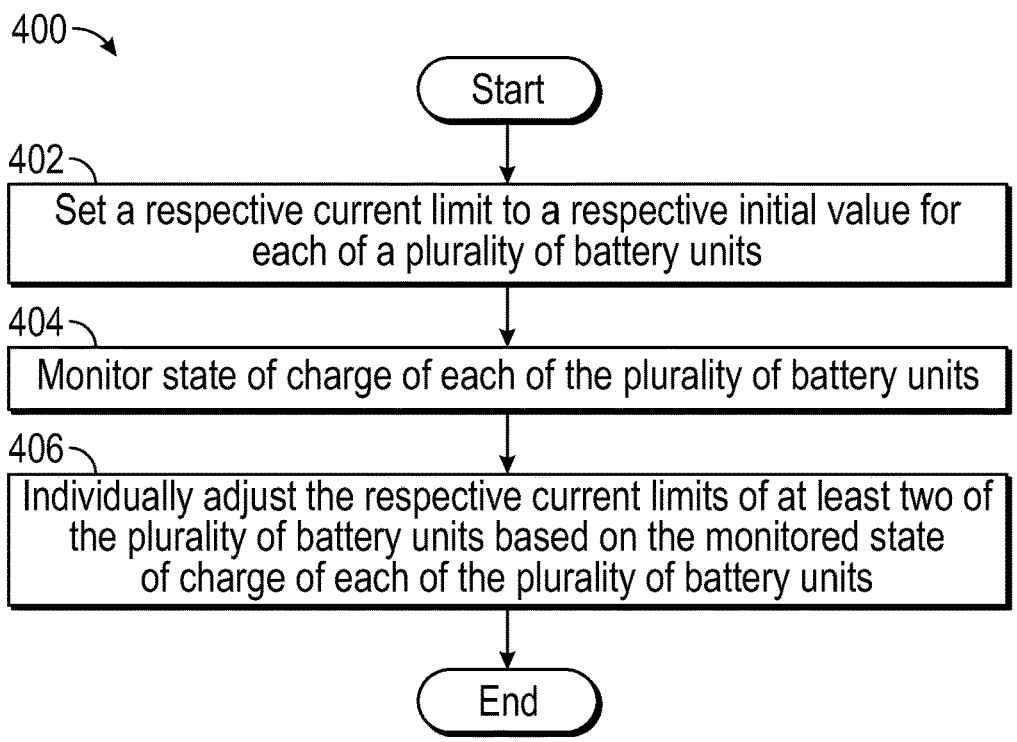
FIG. 4 is a flowchart showing an example of a power source regulation method for supplying power to a system load when a power source is connected to the system load.

FIG. 4 is a flowchart 400 showing an example of a power source regulation method for supplying power to a system load when a power source is connected to the system load. The steps of FIG. 4 will be described with reference to the power source 100 depicted in and described above with reference to FIG. 1B. Other suitable components for implementing one or more of the steps of flowchart 400 will be understood by one of skill in the art from the description herein. It will be understood that one or more steps within flow chart 400 may be omitted and/or performed out of order without departing from the scope of the present invention.

At step 402, set a respective current limit to a respective initial value for each of a plurality of battery units. In an example, controller 160 sets the current limit for each battery unit 102 by providing a current limit value to a controller of a current regulator 174 for each battery unit 102.

At step 404, monitor a state of charge of each of the plurality of battery units. In an example, controller 160 monitors the state of charge by receiving feedback from battery state determining devices 180a-180n that monitor the state of charge of the respective battery units' 102a-102n.

At step 406, individually adjust the respective current limit of at least two of the plurality of battery units based on the monitored state of charge of each of the plurality of battery units. In an example, controller 160 individually adjusts the current limit of each of the plurality of battery units 102a-102n based on a state of charge received from the battery state determining devices 180 in step 404. The controller 160 may adjust the current limit by setting the current limit for each battery unit 102 by providing a revised current limit value to a controller of a current regulator 174. In an example, the controller 160 reduces the current limit for battery units that have a relatively low level of charge (e.g., 5% below that of a battery unit with the higher level state of charge) and/or increase the current limit for battery units that have a relatively high level of charge (e.g., 10% above that of a battery unit with the higher level state of charge). In an example, the current limit decrease/increase is proportional to the relative state of charge.

Steps 404 and 406 may repeat periodically (e.g., once a minute) to ensure that the battery units 102 are discharging evenly.

Figure 5:
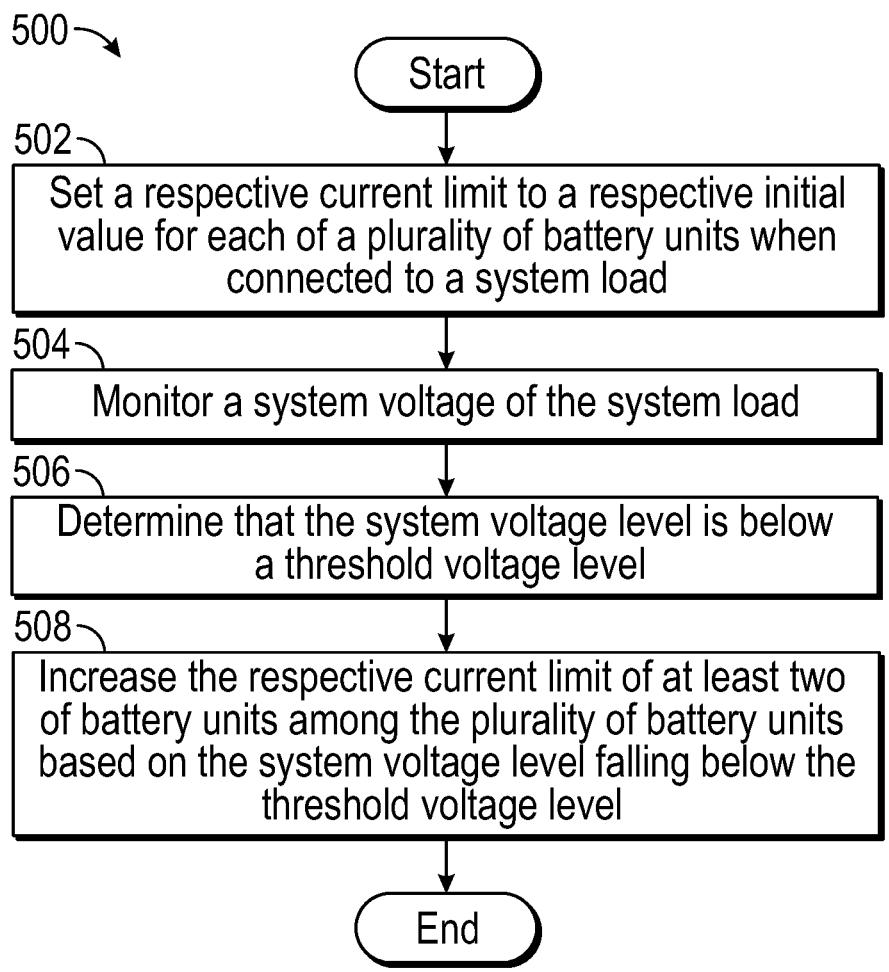
FIG. 5 is a flowchart showing another example of a power source regulation method for supplying power to a system load when a power source is connected to the system load.

FIG. 5 is a flowchart 500 showing an example of a power source regulation method for supplying power to a system load when a power source is connected to the system load. The steps of FIG. 5 will be described with reference to the power source 100 depicted in and described above with reference to FIG. 1B. Other suitable components for implementing one or more of the steps of flowchart 500 will be understood by one of skill in the art from the description herein. It will be understood that one or more steps within flow chart 500 may be omitted and/or performed out of order without departing from the scope of the present invention.

At step 502, set a respective current limit to a respective initial value for each of a plurality of battery units when connected to a system load. In an example, controller 160 sets the current limit for each battery unit 102 by providing a current limit value to a controller of a current regulator 174 for each battery unit 102.

At step 504, monitor a system voltage level of the system load. In an example, controller 160 receives feedback from the system voltage detector 190 to monitor the system voltage level.

At block 506, determine that the system voltage level is below a threshold voltage level. In one example, controller 160 compares the system voltage received from the system voltage detector 190 to a threshold value (e.g., 3.0 volts) to determine if a "droop" voltage condition is present.

At block 508, increase the respective current limit of at least two of the plurality of battery units among the plurality of battery units based on the system voltage level falling below the threshold voltage level. In one example, the controller 160 increases the respective current limit of the at least two battery units to a maximum amount for a temporary period of time (e.g., 20 milliseconds).

Steps 504 through 506 may repeat, e.g., with a 100 millisecond rest between maximum current delivery to avoid damage to the battery units 102.

Figure 6:
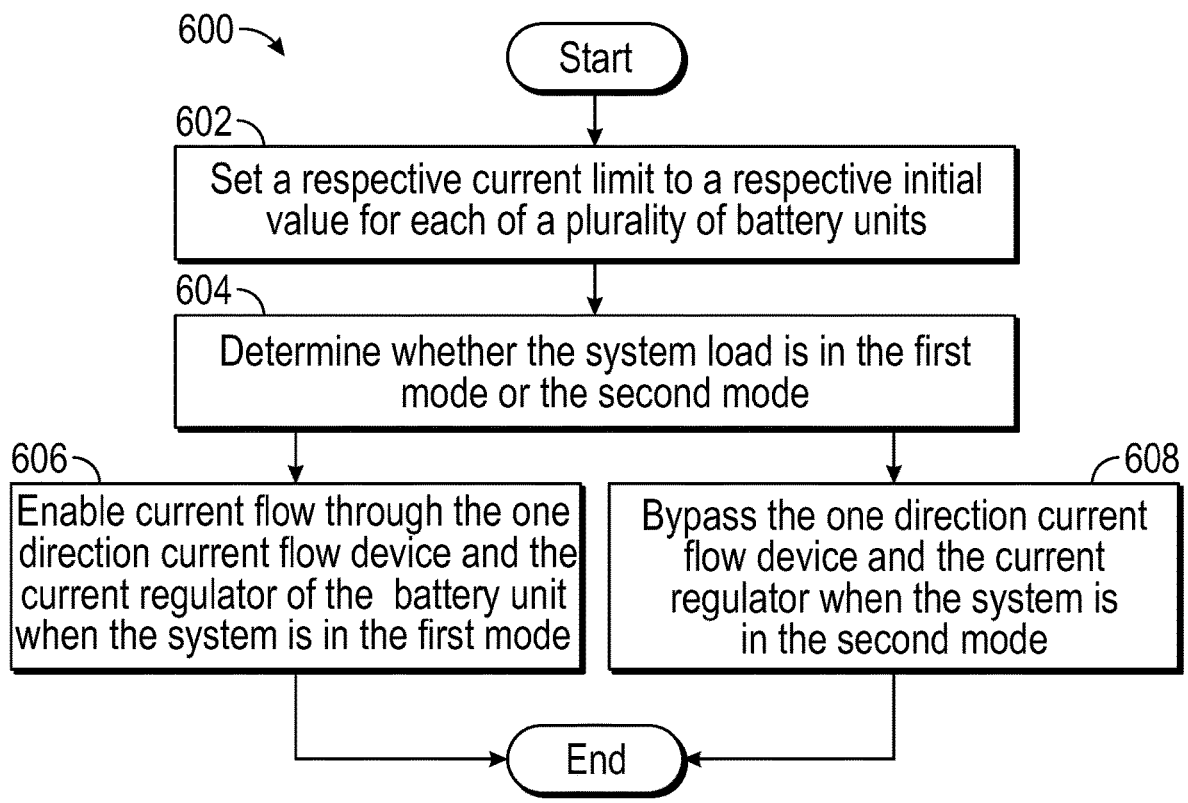
FIG. 6 is a flowchart showing another example of a power source regulation method for supplying power to a system load when a power source is connected to the system load.

FIG. 6 is a flowchart 600 showing an example of a power source regulation method for supplying power to a system load when a power source is connected to the system load. The steps of FIG. 6 will be described with reference to the power source 100 depicted in and described above with reference to FIG. 1B. Other suitable components for implementing one or more of the steps of flowchart 600 will be understood by one of skill in the art from the description herein. It will be understood that one or more steps within flow chart 600 may be omitted and/or performed out of order without departing from the scope of the present invention.

At step 602, set a respective current limit to a respective initial value for each of a plurality of battery units. In an example, controller 160 sets the current limit for each battery unit 102 by providing a current limit value to a controller of a current regulator 174 for each battery unit 102.

At step 604, determine whether the system load is in the first mode (e.g., high power mode, as in active/normal operation mode) or in the second mode (e.g., low power mode such as in sleep/off operation mode). In an example, controller 160 determines the mode of operation based on a signal from a device controller (e.g., controller 300 (FIG. 3) of eyewear 200 (FIG. 2A).

At step 606, which is reached if the system load is determined to be in the first mode in step 604, current from each battery unit is configured to flow in accordance with the set current limit for that battery unit. In an example, the controller 160 enables the one direction current flow device 172 and the current regulator 174 for each battery unit 102 (and disables the Schottky circuit 110) to enable current flow to the load 140.

At step 608, which is reached if the system load is determined to be in the second mode in step 604, current from each battery unit is configured to flow in accordance with a reduced current level. In an example, the controller 160 enables the Schottky circuit 110 for each battery unit 102 (and disables the one direction current flow device 172 and the current regulator 174) to provide reduced current flow to the load 140.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," "includes," "including," or any other variation thereof, are intended to cover a non-exclusive inclusion, such that a process, method, article, or apparatus that comprises or includes a list of elements or steps does not include only those elements or steps but may include other elements or steps not expressly listed or inherent to such process, method, article, or apparatus. An element preceded by "a" or "an" does not, without further constraints, preclude the existence of additional identical elements in the process, method, article, or apparatus that comprises the element.

Unless otherwise stated, any and all measurements, values, ratings, positions, magnitudes, sizes, and other specifications that are set forth in this specification, including in the claims that follow, are approximate, not exact. Such amounts are intended to have a reasonable range that is consistent with the functions to which they relate and with what is customary in the art to which they pertain. For example, unless expressly stated otherwise, a parameter value or the like may vary by as much as ±10% from the stated amount.

In addition, in the foregoing Detailed Description, it can be seen that various features are grouped together in various examples for the purpose of streamlining the disclosure. This method of disclosure is not to be interpreted as reflecting an intention that the claimed examples require more features than are expressly recited in each claim. Rather, as the following claims reflect, the subject matter to be protected lies in less than all features of any single disclosed example. Thus, the following claims are hereby incorporated into the Detailed Description, with each claim standing on its own as a separately claimed subject matter.

While the foregoing has described what are considered to be the best mode and other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present concepts.

The invention claimed is:

1. A power source for delivering power to a system load when connected, the power source comprising:
a plurality of battery units; and
a plurality of power flow devices coupled to the plurality of battery units and configured to provided power from the plurality of battery units to the system load when connected, each power flow device corresponding to a respective one of the plurality of battery units, each power flow device including a one direction current flow device connected in series with a current regulator between the respective battery unit and the system load when connected, wherein the respective current regular is a current regulating load switch device comprising a current sensing amplifier configured to sense current flowing through a current regulating load switch device from the battery unit to the system load when connected, a current regulator configured to regulate current passing from the respective battery unit to the system load when connected, and a current controller coupled to the current sensing amplifier and the current regulator, the current controller configured to monitor sensed current and adjust the current regulator to maintain the current at a set value.

2. The power source of claim 1, wherein:
the one direction current flow devices of the plurality of power flow devices are configured to prevent current from flowing between the plurality of battery units; and
the current regulator of each power flow device is configured to prevent the respective battery unit from exceeding a rated current of the respective battery unit.

3. The power source of claim 1, wherein the current regulator of each of the plurality of power flow devices has a respective current limit and wherein the power source further comprises:
a controller coupled to the plurality of power flow devices, the controller configured to adjust the respective current limit of each power flow device.

4. The power source of claim 3, wherein the respective current limit of the current regulator of at least two of the plurality of current regulators is different.

5. The power source of claim 3, each of the plurality of power flow devices further comprising:
a respective Schottky circuit coupled in parallel with the respective one direction current flow device connected in series with the respective current regulator.

6. The power source of claim 5, wherein:
the respective Schottky circuit, the respective one direction current flow device, and the respective current regulator of each of the plurality of power flow devices are configured to be selectively enabled and disabled by the controller;
the controller is configured to selectively disable the respective Schottky circuit and selectively enable the respective one direction current flow device and the respective current regulator in a first mode of operation; and
the controller is configured to selectively enable the respective Schottky circuit and selectively disable the respective one direction current flow device and the respective current regulator in a second mode of operation.

7. The power source of claim 1, further comprising:
a plurality of chargers, each charger associated with a respective one of the plurality of battery units.

8. The power source of claim 1, further comprising:
a plurality of battery state determining devices, each battery state determining device associated with a respective one of the battery units and configured to determine a state of charge of the respective battery unit; and
a controller coupled to the plurality of battery state determining devices and to the plurality of power flow devices, the controller configured to adjust current output of each of the plurality of battery units based on the state of charge of the plurality of battery units.

9. The power source of claim 1, further comprising:
a system voltage detector coupled to the system load, the system voltage detector configured to detect a system voltage level; and
a controller coupled to the system voltage detector and to the plurality of power flow devices, the controller configured to increase current output of each of the plurality of battery units based on the system voltage level falling below a threshold voltage level.

10. Eyewear comprising:
an optical element;
a power source comprising a plurality of battery units and a plurality of power flow devices coupled to the plurality of battery units and configured to provided power from the plurality of battery units to the system load when connected, each power flow device corresponding to a respective one of the plurality of battery units, each power flow device including a one direction current flow device connected in series with a current regulator between the respective battery unit and the system load when connected; and a support structure configured to support the optical element and the power source.

11. The eyewear of claim 10, wherein the support structure includes a frame having a first side and a second side and wherein the plurality of battery units includes a first battery unit positioned on a first side of the frame and a second battery unit positioned on a second side of the frame.

12. The eyewear of claim 11, further comprising:
a flexible printed circuit board embedded within the frame, the flexible printed circuit board including a power bus coupled to both the first battery unit and the second battery unit.

13. The eyewear of claim 10, wherein:
the one direction current flow devices of the plurality of power flow devices are configured to prevent current from flowing between the plurality of battery units; and
the current regulator of each power flow device is configured to prevent the respective battery unit from exceeding a rated current of the respective battery unit.

14. The eyewear of claim 10, wherein the current regulator of each of the plurality of power flow devices has a respective current limit and wherein the power source further comprises:
a controller coupled to the plurality of power flow devices, the controller configured to adjust the respective current limit of each power flow device.

15. The eyewear of claim 10, wherein the respective current limit of the current regulator of at least two of the plurality of current regulators is different.

16. The eyewear of claim 10, each of the plurality of power flow devices further comprising:
a respective Schottky circuit coupled in parallel with the respective one direction current flow device connected in series with the respective current regulator.

17. A power supply regulation method for supplying power to a system load when connected, wherein the system load includes a first mode and a second mode, the method comprising:
setting a respective current limit to a respective initial value for each of a plurality of battery units, each of the plurality of battery units including a one direction current flow device connected in series with a current regulator between the respective battery unit and a system load when connected;
monitoring a state of charge of each of the plurality of battery units;
individually adjusting the respective current limit of at least two of the plurality of battery units based on the monitored state of charge of each of the plurality of battery units;
enabling current flow through the one direction current flow devices and the current regulators when the system load is in the first mode; and
bypassing the one direction current flow devices and the current regulators when the system load is in the second mode.

18. The method of claim 17, further comprising:
monitoring a system voltage level of the system load; and
increasing the respective current limit of at least two of the plurality of battery units based on the system voltage level falling below a threshold voltage level.

* * * * *